United States Patent [19]

Gordon

[11] 4,180,302

[45] Dec. 25, 1979

[54] CONNECTOR PLUG FOR VEHICLE ELECTRICAL TESTER

[75] Inventor: Thomas C. Gordon, Dearborn Heights, Mich.

[73] Assignee: Ford Motor Company, Dearborn, Mich.

[21] Appl. No.: 970,787

[22] Filed: Dec. 18, 1978

[51] Int. Cl.² .................. H01R 19/18; G01R 31/02
[52] U.S. Cl. .................. 339/143 T; 324/51; 339/182 R
[58] Field of Search .............. 324/51, 53, 15, 73 R, 324/133, 158 MB; 339/143, 89 R, 182, 183, 10, 42, 154 A; 219/262, 270

[56] References Cited

U.S. PATENT DOCUMENTS

| 3,145,337 | 8/1964 | Lipson | 324/53 |
|---|---|---|---|
| 3,281,756 | 10/1966 | O'Keefe | 339/89 R |
| 3,617,870 | 11/1971 | Howes | 324/15 |
| 3,737,767 | 6/1973 | Slutsky | 324/51 |
| 3,783,378 | 1/1974 | Mildner | 324/73 R |
| 3,813,632 | 5/1974 | Drewry | 339/10 |

Primary Examiner—Neil Abrams
Assistant Examiner—John S. Brown
Attorney, Agent, or Firm—Peter Abolins; Clifford L. Sadler

[57] ABSTRACT

This specification discloses a connector plug for connecting a vehicle electrical system tester to the cigar lighter socket of a vehicle for the purpose of testing portions of the vehicle electrical system. The connector plug can have two separate connections to the positive side of the battery so that one connection can be used to power the tester and, independently, the other connector can be used to monitor the voltage change across the battery. Further, the plug can also include a static shield for eliminating a static electric charge on the vehicle electrical system tester as the plug is inserted into the cigar lighter thus preventing the static charge from damaging sensitive measurement circuitry or altering memory circuitry.

7 Claims, 3 Drawing Figures

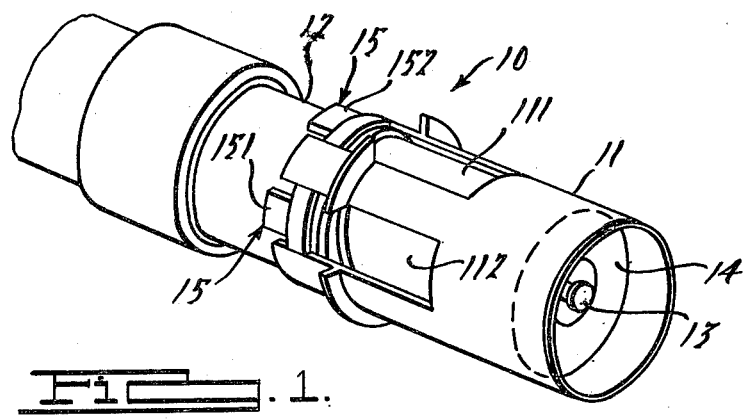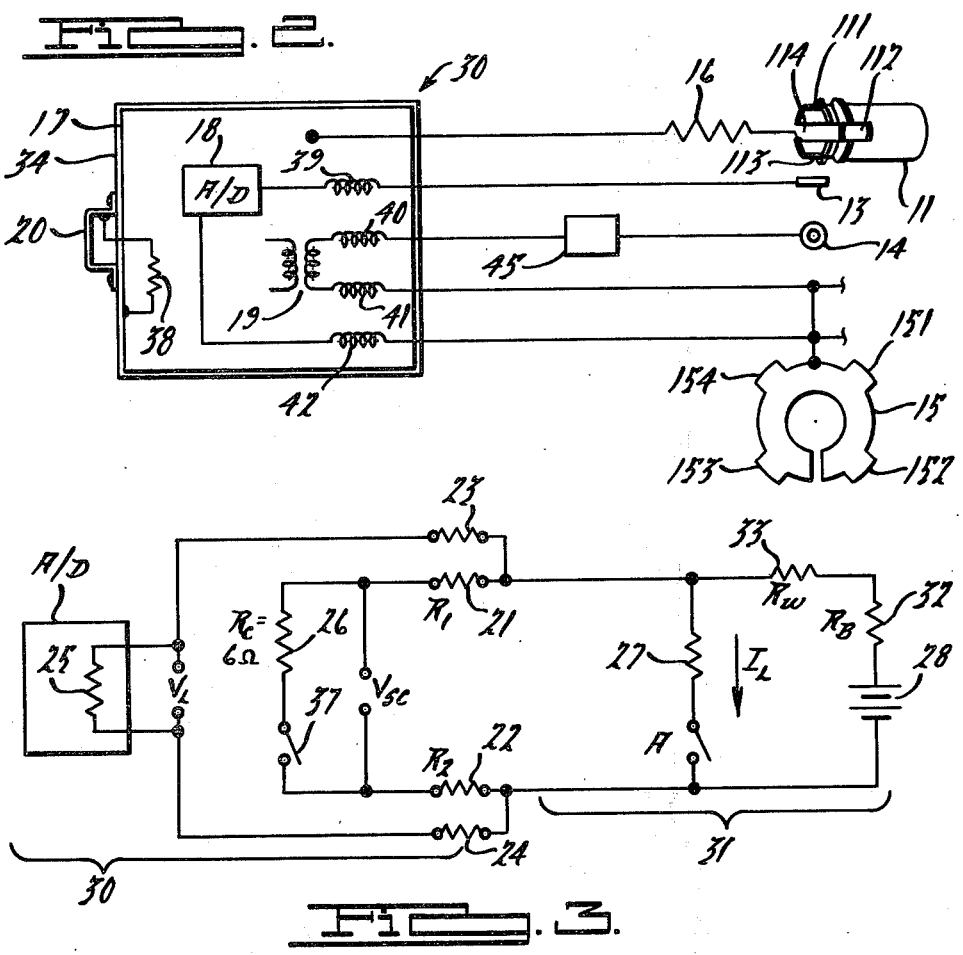

CONNECTOR PLUG FOR VEHICLE ELECTRICAL TESTER

BACKGROUND OF THE INVENTION (1) Field of the Invention

This invention relates to connector plugs and, in particular, to connector plugs for test equipment.

(2) Prior Art

Various electrical connector plugs for test equipment are known. For example, a simple alligator clip can be used to secure connection to a portion of the circuit desired to be tested. It may be difficult to find an exposed conductive surface to which the alligator clip can be secured.

There are also known connectors with male and female sockets uniquely shaped for connection to each other. However, the testing of an automobile vehicle electrical system during manufacture could require that one of the uniquely shaped sockets be installed in the automobile. This is undesirable because of wasted cost and time to install a unique socket for the sole purpose of testing.

Static electricity also presents a problem for a relatively sensitive piece of equipment. That is, connection of a measuring probe when the tester is carrying a static charge can damage the tester and give an erroneous reading. The discharge can cause a voltage of a magnitude substantially larger than any voltage intended to be measured and may damage the test equipment, alter stored information necessay for equipment operation, or reduce its ability to provide accurate voltage measurements. Although there are known ways of removing a static charge from a tester, a more convenient and foolproof means would be desirable. Forgetting to discharge the tester just once could cause expensive damage and unreliable test results. These are some of the problems this invention overcomes.

SUMMARY OF THE INVENTION

This invention recognizes that connection of test equipment to the cigar lighter socket of an automobile vehicle can be useful in testing the vehicle electrical system and teaches an apparatus for accomplishing such connection. The cigar lighter recepticle or socket is a relatively inexpensive component of an automobile connected in parallel with the vehicle electrical system and the vehicle battery and serves to hold a heating element and supply electricity to the heating element when the heated element is actuated. The dimensional parameters of the cigar lighter receptacle typically are not held to close tolerances and it is not particularly well suited for connection of a relatively sensitive piece of test equipment. The electrical resistance of the connection can be relatively high and vary significantly in magnitude from one connection point to another connection point. When the test equipment is powered by current drawn through the cigar lighter recepticle, there can be a contact resistance voltage drop substantially larger than the voltage variations to be measured. Thus, the voltage measurement can be inaccurate and the measuring circuitry can be exposed to damaging voltages. This invention is a connector plug for connecting an apparatus used for testing a vehicle electrical system to the cigar lighter socket of the vehicle. The invention recognizes that it is desirable to have two physically spaced contacts to substantially the same electrical point. A first contact connects a signal processing component to the vehicle and is adapted to contact a portion of the cigar lighter socket carrying a positive battery voltage. A second contact, spaced from the first contact, is adapted for connecting a power supply means for the test apparatus to a portion of a cigar lighter socket carrying a positive battery voltage. The connector plug can further include a static shield means relatively movable with respect to the first and second contacts and biased to extend beyond the first contact so as to strike the cigar lighter socket before the first contact when inserting the connector plug into the cigar lighter socket so as to discharge static from the connector plug. The connector plug can also include a ground terminal for completing the circuit of the first and second contacts through a terminal to the ground portion of the cigar lighter socket.

A connector plug in accordance with an embodiment of this invention improves the accuracy of the test apparatus. The test apparatus can be powered through the second of the positive connections so that the voltage drop of the powering current occurs at the connection resistance of the second connector. This forces the first connector to be particularly adapted for measuring voltage changes in response to actuation of a portion of the vehicle electrical system.

BRIEF DESCRIPTION OF THE DRAWINGS

FIG. 1 is a front perspective view of a connector plug in accordance with an embodiment of this invention;

FIG. 2 is a partly schematic, partly block view of a test aparatus and a connection to a connector plug in accordance with an embodiment of this invention; and FIG. 3 is a schematic diagram of the electrical connection of a test apparatus to an automobile vehicle electrical system through a connector plug in accordance with an embodiment of this invention.

DETAILED DESCRIPTION OF THE PREFERRED EMBODIMENT

Referring to FIG. 1, a connector plug 10 adapted for insertion into the socket of a cigar lighter of an automobile, includes a movable, hollow, cylindrical conductive static shield 11, surrounding a central core 12. The forward end of central core 12 includes a voltage measuring positive contact 13 and a spaced, current drawing positive contact 14. Voltage measuring positive contact 13 is typically a small cylindrical protrusion from the forward end face of the central core 12. Advantageously, the tip of contact 13 is scored to provide sharp projections which insure a good contact. Current drawing positive contact 14 is a ring-like member spaced from and surrounding contact 13 around the forward periphery of central core 12. Ground contact 15 is located at the rear of central core 12 and complete a circuit to the ground of the cigar lighter socket from contacts 13 and 14. The remainder of central core 12 is formed of a structural insulating material such as teflon or nylon.

Static shield 11 is relatively movable with respect to central core 12 and extends forward of contacts 13 and 14 so that the first portion of connector plug 10 to touch the cigar lighter socket is static shield 11. As a result, static electricity from connector plug 10 is discharged and does not apply an undesirably high voltage to voltage measurement positive contact 13 or 14. Connector plug 10 can have an internal spring (not shown) for biasing static shield 11. Ground contact 15 is also shown in FIG. 2 to have four radially protruding contacts (151, 152, 153 and 154) for completing the contact between the cigar lighter socket and ground contact 15. Static shield 11 is shown in FIG. 1 with longitudinal slots 111 and 112 for passing contacts 152 and 151 respectively. Additional slots 113 and 114, shown in FIG. 2, pass contacts 153 and 154. Static shield 11 further includes a ridge 115 extending circumferentially around static shield 11 between the slots. Ridge 115 protrudes sufficiently so that it can engage the front of the cigar lighter socket and hold static shield 11 back while the remainder of connector plug 10 continues into the cigar lighter socket.

Referring to FIG. 2, the electrical connection between connector plug 10 and a test apparatus 30 includes a resistor 16 connected between static shield 11 and a conductive coating 17 on the interior of a case 34 of test apparatus 30. The test apparatus includes an analog to digital converter 18 for processing voltage measurements made by voltage measuring positive contact 13. Current drawing contact 14 is connected through a chopping circuit 45 and a transformer 19 to a ground contact 15. Chopping circuit 45 acts to convert a direct current voltage to an alternating current voltage for use by transformer 19. Contact 13 is also connected to ground contact 15 through analog to digital converter 18. A handle 20 is attached to test apparatus 30 and electrically connected through a resistor 38 to conductive coating 17 to discharge through static shield 11. Resistor 38 is typically about 100 kΩ. Inductors 39, 40, 41 and 42 are connected in series with input circuits to further reduce the effects of static electricity. More specifically, inductor 39 is connected between contact 13 and A/D converter 18, inductor 40 is connected between contact 14 and transformer 19, inductor 41 is connected between ground contact 15 and transformer 19, and inductor 42 is connected between ground contact 15 and A/D converter 18.

Referring to FIG. 3, a typical connection of a test apparatus 30 to a vehicle electrical system 31 includes resistors 21 and 22, which are the cigar lighter contact resistance values for current drawing positive contact 14 and ground contact 15; and resistors 23, 24 which are the cigar lighter contact resistances for voltage measurement positive contact 13 and ground contact 15. Analog to digital converter 18 has an internal resistance 25 connected in series to resistors 23 and 24. Resistances 23 and 24 are relatively insignificant compared to resistor 25 which is the input impedance of analog to digital converter 18 and has a magnitude, for example, of about 10 mega ohms. For example, resistors 21, 22, 23 and 24 can have a value of about 0 to 0.005 ohms.

A resistor 26 is connected in series with resistors 21 and 22 and is a calibration resistor having a magnitude of approximately, for example, 6 ohms. A resistor 27 is connected in parallel with the series combination of a vehicle battery 28, and resistors 32 and 33. Resistor 27 is the vehicle device resistance which carries an electrical current $I_L$ through it and produces the voltage $V_L$ to be measured by voltage measurement positive contact 13. The vehicle device resistance is that portion of the vehicle electrical system which is being tested, e.g., the brakelamps. Resistance 33 is a wiring resistance having a magnitude of approximately 0.01 ohms and resistor 32 is the internal battery resistance having a magnitude of approximately 0.02 ohms. In solving the circuit of FIG. 3, the error involved in calculating the current through resistor 27 is found to be relatively small. Thus, the current characterizing the portion of the vehicle electrical system under test is relatively accurate.

$I_L$ is found to be as follows:

$$I_L = V_{L1} - V_{L2}/R_E + R_W,$$

$V_{E1} = V_L$ prior to closing switch A
$V_{L2} = V_L$ after closing switch A In solving for $R_B + R_W$ using a typical single circuit cigar lighter socket connector, the analog to digital converter measures voltage $V_{SC}$ and the following results:

$$R_B + R_W = (V_{C1} - V_{C2})$$
$$(R_C + R_1 + R_2)/V_{C2} - (R_1 + R_2)$$

wherein $V_{C1}$ is $V_{SC}$ with switch 37 open; and $V_{C2}$ is $V_{SC}$ with switch 37 closed. Since the term $R_1 + R_2$ can be up to 0.01 ohms, approximately a 50% error may occur. In solving for $R_B + R_W$ using the proposed dual circuit cigar socket connector, the following results:

$$R_B + R_W = (V_{C1} - V_{C2})(R_C + R_1 + R_2)/V_{C2}$$

where $V_{C1}$ and $V_{C2}$ are measured at $V_L$
The error involved is $R_1 + R_2/R_C 0.01/6 = 0.2\%$ which is relatively insignificant.

In operation, the use of connector plug 10 allows relatively accurate calculation of the electrical current draw of the various automobile electrical systems by a voltage measurement at the cigar lighter socket. The device makes two independent positive electrical connections to the automobile cigar lighter so that the effect of drawing power from the automobile battery for use by the tester can be isolated from the measurement of voltage produced by actuation of selected portions of the vehicle electrical system. For current draw to be calculated from measurements at the cigar lighter socket, a known resistive load is applied to a cigar lighter recepticle or socket and the resultant voltage drop due to internal resistance of the vehicle battery and to the wiring resistance is measured. Such a known load can be applied by closing a switch 37 in series with resistor 26. The voltage drop due to most of the current flow through the cigar lighter connector contacts is excluded by use of an additional set of contacts in the cigar lighter socket connector at which an insignificant voltage drop is occurring due to the extremely small amount of current draw required by the voltage measuring device.

Static shield 11 is included in the circuit to protect the circuitry from damage and to prevent alteration of stored memory signals. That is, static electricity from test apparatus 30 discharges through static shield 11 when connector plug 10 is being inserted into the recepticle of a cigar lighter. Resistor 16, connected in series with static shield 11 slows the discharge through static shield 11 so that the radio frequency (RF) interference is minimized. That is, the amplitude of the spike caused by discharge is reduced and the interference is also reduced. A typical magnitude for resistor 16 is about 100 ohms.

Various modifications and variations will no doubt occur to those skilled in the various arts to which this invention pertains. For example, the particular shape of the positive contacts may be varied from that disclosed herein. These and all variations which basically rely on the teachings through which this disclosure has advanced the art are properly considered within the scope of this invention.

What is claimed is:

1. A connector plug for connecting a test apparatus used for testing a vehicle electrical system to the socket of a cigar lighter of a vehicle, said connector plug comprising:
   a first contact adapted for connecting a signal processing component to the vehicle, said first contact being adapted to contact a portion of the cigar lighter socket carrying a positive battery voltage;
   a second contact, spaced from said first contact adapted for connecting a power supply means for the test apparatus to the portion of the cigar lighter socket carrying a positive battery voltage, said first and second contacts being connected to substantially the same electrical point;
   a static shield means relatively movable with respect to said first contact and biased to extend beyond said first contact so as to strike the cigar lighter socket before said first contact strikes the cigar lighter socket when inserting said connector plug into said cigar lighter socket so as to discharge static electricity from the test apparatus; and
   a ground terminal for completing the circuit of said first and second contacts, and adapted to be connected to ground potential of the vehicle when said connector plug is connected to the cigar lighter socket.

2. A connector plug as recited in claim 1 wherein a resistor is coupled to said static shield means so as to reduce the rate of discharge through said static shield means and thereby reduce radio frequency (RF) noise.

3. A connector plug as recited in claim 1 wherein said ground terminal is positioned aft of said first terminal and is adapted to contact the front opening of the cigar lighter having a connection to the vehicle battery ground.

4. A connector plug as recited in claim 3 wherein said second contact is generally ring-like in shape and said first contact is located within the ring-like boundary of said second contact.

5. A connector plug as recited in claim 4 wherein said static shield means is generally a hollow cylinder of a conductive material having a central opening for receiving therein said first and second contacts.

6. A connector plug as recited in claim 5 wherein said static shield means is biased with respect to said first contact and movement of said shield means rearward does not cover said ground terminal.

7. A connector plug as recited in claim 6 wherein said ground terminal has a plurality of radially extending contacts, said static shield means has a raised ridge around at least a portion of the circumference of said static shield means for engaging the cigar lighter socket so as to retract said static shield means with respect to said first contact as said connector is inserted into the cigar lighter socket, and said static shield means further comprising a plurality of generally longitudinal slots for passing said radially extending contacts so that said ground terminal can be brought into contact with said cigar lighter socket.

* * * * *